(12) United States Patent
Stowell, Jr.

(10) Patent No.: US 7,247,221 B2
(45) Date of Patent: Jul. 24, 2007

(54) SYSTEM AND APPARATUS FOR CONTROL OF SPUTTER DEPOSITION PROCESS

(75) Inventor: Michael W. Stowell, Jr., Loveland, CO (US)

(73) Assignee: Applied Films Corporation, Longmont, CO (US)

( * ) Notice: Subject to any disclaimer, the term of this patent is extended or adjusted under 35 U.S.C. 154(b) by 604 days.

(21) Appl. No.: 10/438,380

(22) Filed: May 15, 2003

(65) Prior Publication Data

US 2004/0026235 A1    Feb. 12, 2004

Related U.S. Application Data

(60) Provisional application No. 60/381,482, filed on May 17, 2002.

(51) Int. Cl.
*C23C 14/35* (2006.01)
(52) U.S. Cl. .................. 204/192.12; 204/192.13; 204/298.03; 204/298.08
(58) Field of Classification Search ........... 204/192.12, 204/192.13, 298.03, 298.06, 298.08, 298.19
See application file for complete search history.

(56) References Cited

U.S. PATENT DOCUMENTS

| | | |
|---|---|---|
| 4,124,474 A | 11/1978 | Bonchil et al. |
| 4,166,018 A | 8/1979 | Chapin |
| 4,166,784 A | 9/1979 | Chapin et al. |
| 4,356,073 A | 10/1982 | McKelvey |
| 4,420,385 A | 12/1983 | Hartsough |
| 4,434,038 A | 2/1984 | Morrison, Jr. |
| 4,851,095 A | 7/1989 | Scobey et al. |
| 4,931,169 A * | 6/1990 | Scherer et al. ......... 204/298.11 |
| 5,433,835 A | 7/1995 | Demaray et al. |
| 5,487,822 A | 1/1996 | Demaray et al. |
| 5,507,931 A | 4/1996 | Yang |

(Continued)

FOREIGN PATENT DOCUMENTS

| | | | |
|---|---|---|---|
| JP | 11-158620 | * | 6/1999 |
| JP | 2000-034564 | * | 2/2000 |
| JP | 2001-262355 | * | 9/2001 |

OTHER PUBLICATIONS

Machine Translation of 2000-034564.*

(Continued)

*Primary Examiner*—Rodney G. McDonald
(74) *Attorney, Agent, or Firm*—Paul V. Storm; John J. Patti; Storm LLP (57) ABSTRACT

A method and apparatus for sputter deposition in which both a pulsed DC power supply and an RF power supply apply power to the target in the sputter deposition equipment. The pulsed DC power supply provides an on cycle where power is applied to the target, and an off cycle, in which a reverse polarity is applied to the target. The application of the reverse polarity has the effect of removing any charge that may have built up on the surface of the target. This reduces the likelihood of arcing occurring on the surface of the target, which can degrade the quality of the film being deposited on the substrate. By applying RF power simultaneously with the pulsed DC power to the target, the ionization efficiency on the target surface is increased. This results in a greater amount of material being removed from the target surface more quickly.

64 Claims, 6 Drawing Sheets

U.S. PATENT DOCUMENTS

| | | | |
|---|---|---|---|
| 5,565,071 | A | 10/1996 | Demaray et al. |
| 5,584,972 | A | 12/1996 | Lantsman |
| 5,584,974 | A * | 12/1996 | Sellers .................. 204/192.13 |
| 5,595,337 | A | 1/1997 | Demaray et al. |
| 5,603,816 | A | 2/1997 | Demaray et al. |
| 5,667,645 | A | 9/1997 | Leiphart |
| 5,830,330 | A | 11/1998 | Lantsman |
| 5,873,989 | A | 2/1999 | Hughes et al. |
| 5,948,215 | A * | 9/1999 | Lantsman .............. 204/192.12 |
| 6,290,821 | B1 | 9/2001 | McLeod |
| 6,328,806 | B2 | 12/2001 | Eller |
| 6,365,009 | B1 | 4/2002 | Ishibashi |

OTHER PUBLICATIONS

Akira Shibata, "Deposition of Tio2 Films by Reactive Sputtering in Magnetic Field," Japanese Journal of Applied Physics, vol. 30, No. 4A, Apr. 1992, pp. L650-L652, Japan.

Kadlec et al., "Reactive Deposition of TiN Films Using an Unbalanced Magnetron," Surface and Coatings Technology, 39/40 (1989), pp. 487-497, Czechoslovakia.

Savvides, et al. "Unbalanced Magnetron Ion-Assisted Deposition and Property Modification of Thin Films," J. Vac. Sci. Technol., A4(3), May/Jun. 1986, pp. 504-508, Australia.

Ido et al., "Measurements of Plasma Controlled by Compressed Magnetic Field Magnetron Sputtering Technique," Jpn J. Appl. Phys., vol. 21 (1993) pp. 2112-2115, Part 1, No. 5A, May 1993, Japan.

Danroc, et al., "Reactive Magnetron Sputtering of TiN: Analysis of the Deposition Process," Surface and Coatings Technology, 33 (1987), pp. 83-90, France.

Karim, et al. "Deposition of Tin-Coped Indium Oxide Films by a Modified Reactive Magnetron Sputtering Process," Thin Solid Films, 172 (1989), pp. 111-121, U.S.

Belkind, et al., "Enhancement of Reactive Sputtering Rate of T102, Using a Planar and Dual Rotatable Cylindrical Magnetrons," Thin Solid Films, 248 (1994), pp. 163-165, U.S.

Kukia, et al., "High Rate Sputtering of Metals and Metal Oxides with a Moving Plasma Zone," Thin Solid Films (1993), pp. 51-55, Germany.

Sargent, et al., "Metal Mode Reactive Sputtered Metal-Dielectric Coatings," Sargent, et al., Society of Vacuum Coaters, 38th Annual Technical Conference Proceedings (1993), pp. 68-74, U.S.

Belkind et al., "Reactive Co-Sputtering of Oxides and Nitrides Using a C-Mag Rotatable Cylindrical Cathode", Surface and Coatings Technology, 49 (1991), pp. 155-160, U.S.

Seddon et al., "MetaMode: A New Method for High Rate MetaMode Reactive Sputtering," SPIE, vol. 1323, Optical Thin Films III, New Developments (1990), pp. 122-126, U.S.

Combadiere, et al., "Study and Control of Both Target-Poisoning Mechanisms and Reactive Phenomenon in Reactive Planar Magnetron Cathodic Sputtering of TiN," Surface and Coatings Technology 82 (1996), pp. 145-157, France.

Roth, et al., "Process Control of Magnetron Sputtering of TiN Coatings Studied by In Situ AES and Plasma Diagnostics," Surface and Coatings Technology 74-75 (1995), pp. 461-468, Germany.

Voevodin, et al., "Active Process Control of Reactive Sputter Deposition," Vacuum, vol. 46, No. 7 (1995), pp. 723-729, U.K.

Jung et al., "High Rate Deposition of Alumina Films by Reactive Gas Flow Sputtering," Surface and Coatings Technology, 59 (1993), pp. 171-176, Germany.

Pedersen, et al., "PC System for Improving the Control of Reactive Gas Dosage in Sputtering Processes for Film Deposition," Surface and Coatings Technology, 59 (1993), pp. 110-112, Denmark.

Sproul, W.D., "Control of a Reactive Sputtering Process for Large Systems," Society of Vacuum Coasters, 36th Annual Conference Proceedings (1993), pp. 504-509, U.S.

Rao, et al., "Influence of Oxygen Partial Pressure on the Glow Discharge Characteristics During DC Reactive Magnetron Sputtering," Vacuum, vol. 42, Nos. 8 & 9 (1991), pp. 515-517, India.

Skerlavaj, et al., "Optimizing Optical Properties of Reactively Sputtered Titanium Nitride Films," Thin Solid Films, 186 (1990), pp. 15-26, Sweden.

Sproul, et al., "Advances in Partial-Pressure Control Applied to Reactive Sputtering," Surface and Coatings Technology, 39-40 (1989), pp. 499-505, U.S.

Zega, B., "Hard Decorative Coatings by Reactive Physical Vapor Deposition: 12 Years of Development," Surface and Coatings Technology, 39/40 (1989), pp. 507-520, Switzerland.

Wautelet, et al., "Modeling Temperature Effects in Reactive Sputtering of Compound Materials," Surface and Coatings Technology, 74-75 (1995), pp. 238-240, Belgium.

Koss et al., "Computational Model of Reactive Sputtering," J. Vac. Sci. Technol. A, vol. 11, No. 3, May/Jun. 1993, pp. 701-703, U.S.

Tsiogas, et al., "Monte Carlo Simulation of High Rate Reactive Sputtering of Tin Oxide in Planar D.C. Magnetron Systems," Thin Solid Films, 219 (1992), pp. 270-277, Greece.

Spencer et al., "Dynamic Control of Reactive Magnetron Sputtering: A Theoretical Analysis," Thin Solid Films, 186 (1990), pp. 129-136, U.K.

Schiller, et al., "The Effect of Target-Substrate Coupling on Reactive Direct Current Magnetron Sputtering," Surface and Coatings Technology, 39/40 (1989), pp. 549-564, Germany.

Westwood, W.D. "Reactive Sputtering," Physics of Thin Films, vol. 14 (1989), pp. 1-79,Canada.

Spencer, et al., "Pressure Stability in Reactive Magnetron Sputtering," General Film Behavior (1987), pp. 141-149, U.K.

Wright, et al., "Design Advances and Applications of the Rotatable Cylindrical Magnetron," J. Vac. Sci. Technol. A 4 (3), May/Jun. 1986, pp. 388-392, England.

Billiard, et al., "Attempted Modelling of Thickness and Chemical Heterogeneity in Coatings Prepared by D.C. Reactive Magnetron Sputtering," Surface and Coatings Technology, 59 (1993), pp. 41-47, France.

Musil, et al., "Reactive Sputtering if T1N Films at Large Substrate to Target Distances," Vacuum, vol. 40, No. 5 (1990), pp. 435-444, Czechoslovakia.

Munz, et al., "Reactive High Rate Sputtering of Oxides," Thin Solid Films, 86 (1981), pp. 175-181, Germany.

Schiller, et al., "Reactive D.C. Sputtering with the Magnetron-Plasmatron for Tantalum Pentoxide and Titanium Dioxide Films," Thin Solid Films, 63 (1979), pp. 369-375, Germany.

Sekiguchi, et al., "Enhancement of the Deposition Rate of T1O2 Film in Radio Frequency Reactive Sputtering," J. Vac. Sci. Technol. A-12(6), Nov./Dec. 1994, pp. 3176-3179, Japan.

Alam, et al., "Ozone in Reactive Gas for Producing Tin-Doped Indium Oxide Films by DC Reactive Magnetron Sputtering," Elsevier Science S.A., (1996) pp. 003-008, Japan.

Tamoto, et al., "Reactive Sputtering which Separates Sputtering Process and Reactive Process," non-published paper, Japan.

Tamoto, et al., "Two Stages High Rate Reactive Sputtering, Divided Sputter Process and Oxidation Process," Shincron Co., Ltd. (1995), pp. 88-93, Japan.

* cited by examiner

SYSTEM AND APPARATUS FOR CONTROL OF SPUTTER DEPOSITION PROCESS

CLAIM OF PRIORITY

This application claims priority from U.S. Provisional Patent Application No. 60/381,482 entitled "Pulsed Electrical Sputtering Deposition System and Apparatus" filed on behalf of Michael W. Stowell, Jr. on May 17, 2002.

BACKGROUND

Thin film conductive and non-conductive coatings on a substrate have many uses in industry, including coatings on flat panel displays, semiconductors, touch screen displays, energy control coatings on glass, and optical interference filters, among other uses.

These films are applied to surfaces in a variety of methods. One commonly used method is referred to as sputter deposition. Typically, in a sputter deposition process, the article to be coated, the substrate, is placed in a chamber. A plate of the material to be used in the coating, called the target, is also placed inside the chamber. The target is electrically connected to a voltage source, and serves as an electrical cathode/target. Typically, the sputtering chamber is evacuated, and a gas under pressure is pumped into the chamber. The gas selected for use in the chamber is dependent upon whether the sputtering process is to be a reactive or non-reactive process. If it is a reactive process, the gas is selected such that it reacts with the material of the target to form the desired material to be sputtered onto the substrate. For non-reactive sputtering, an inert, non-reactive gas is selected.

The target is electrically energized. The electrical field between the anode of the electrical source and the cathode/target will ionize the gas in the chamber. The gas ions are then driven into the target by the electrical field. When this is done with sufficient energy, some of the material is dislodged from the target. The dislodged material typically becomes electrically neutral a short distance from the target, and travels through the chamber from the target to the surface of the substrate. If the process is a reactive sputtering process, the dislodged material reacts with the gas as it is traveling through the chamber and may also be reacted at the surface of the substrate. At the substrate, the target material or reacted target material forms a thin film coating on the surface of the substrate. This method produces a high quality film, but the speed of sputtering must sometimes be very slow to overcome certain problems associated with the sputter deposition process and still maintain a consistent film coating.

There are several problems associated with sputter deposition processes, and in particular with reactive sputter deposition processes. For example, as the material is being sputtered, reactions can occur between the gas in the chamber and the target surface, forming a dielectric layer on the target that can act like a capacitor and cause electrical arcing. The arcing can cause uneven application of material to the substrate and defects in the coating. Varying the voltage applied or the speed at which sputtering is performed have helped reduce the problems and improve the quality of the film coating, but have not been completely successful in achieving all of these goals.

Non-reactive sputter deposition processes are relatively fast. Arcing typically occurs more frequently in reactive sputter deposition processes because reactions between the target material and the gas in the chamber occur more frequently. For this and other reasons, reactive sputter deposition is generally performed more slowly than non-reactive sputtering.

A variety of types of electrical sources have been used in an attempt to reduce or compensate for the electrical arcing that occurs. Electrical voltage sources used have included direct current (DC), alternating current (AC), and radio frequency (RF). While the different electrical sources have been found to reduce the incidence of arcing in certain configurations, there have continued to be problems with the systems. Additionally, with reactive sputtering, the speed at which deposition could be performed is still very slow, which increases the time necessary to produce an acceptable product, and therefore kept costs fairly high.

Therefore, what is needed is a system and method for performing sputter deposition that reduces or eliminates electrical arcing from the target, that does not impact the quality of the film being deposited and minimizes the reduction in speed of coating, especially when reactive sputtering is used.

SUMMARY

Non-conductive and conductive sputtered film property requirements have continually become more stringent with advances in technology. The existing magnetron sputtering processes are limited in some respects in their ability to effectively control film properties that meet these new requirements. Existing apparatus and processes can and do exhibit power limitations as well as the inability to finely control the sputtering process energies.

The use of pulsed power supplies, both alternating current (AC) and direct current (DC), has benefited many film deposition processes and film properties, especially in transparent films, by better controlling the sputtering energies. This control is achieved due to the fact that these pulsed power supplies inherently extinguish and re-ignite the plasma at user-defined frequencies and intensities. At the beginning of each power pulse or plasma ignition from either of these systems, there is a broader distribution of electron energies producing ions and therefore, a greater percentage of the sputtered material is generated.

With pulsed DC power there are many beginnings and plasma ignitions to increase the average electron energies to a much higher value, thus benefiting the process. By controlling the pulse duration, duty cycle, the electron/ion energies, and the number of pulses generated, specific sputtered material can be controlled. Using pulsed DC power can give the operator effective control over more of the sputtered thin film properties.

Pulsed DC power supplies, during each "off" cycle, typically provide a reversed polarity to the target to remove charge build up on the surface of the target/cathode and thus reduce the chances of an arc. This method is very effective in reducing the total number of arcs the target/cathode may eventually incur. Further, depending on the frequency of the pulsed DC power supply, removing current from the target surface can act as an arc suppressant to limit the amount of energy which each arc that might occur would contain.

While using pulsed DC power can be more effective than using other current sources and provide a more consistent sputtered film, it was felt that there might be other improvements that could be made to the system to further reduce problems with dielectric build up on the target surface and increase efficiency. In experiments, it was found that by applying radio frequency (RF) power simultaneously with pulsed DC power to the cathode/target, the ionization efficiency on the target surface was increased. This increase in ionization efficiency allowed more of the oxidized material to be removed from the surface faster than it would be removed without it. With less oxidized material, the arcing frequency was reduced and therefore the film properties enhanced. Another benefit of this ionization efficiency enhancement is that it resulted in a more even etching of the entire target surface, rather than just a track in the center area of the target, as commonly occurs.

The use of pulsed DC power in conjunction with RF power can be an effective method to improve film quality by accurately controlling the maximum electron/ion energies at which a sputtered material is generated, enhancing the average electron/ion energy, and by the removing oxidized particles, thereby reducing the arcing of materials into the substrate.

In summary this discovery allows the user to achieve higher yields and higher quality thin films than the prior art. The yield increases are a result of less arcing which means there is less particulate contamination, no "banding" of the substrate, and a reduced likelihood for damage to the target surface at higher deposition powers and/or speeds. The higher quality thin films are achieved from the ability to actively control the electron/ionization energies by adjustment of pulsing frequency and dwell times.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the discussion of the FIGURES, the same reference numerals will be used throughout to refer to the same or similar components. In the interest of conciseness, various other components known to the art, such as vacuum sputter deposition chambers, and the like necessary for performing sputter deposition coating, have not been shown or discussed.

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

Refer now to the drawings wherein depicted elements are, for the sake of clarity, not necessarily shown to scale and wherein like or similar elements are designated by the same reference numeral through the several views.

Figure 1:
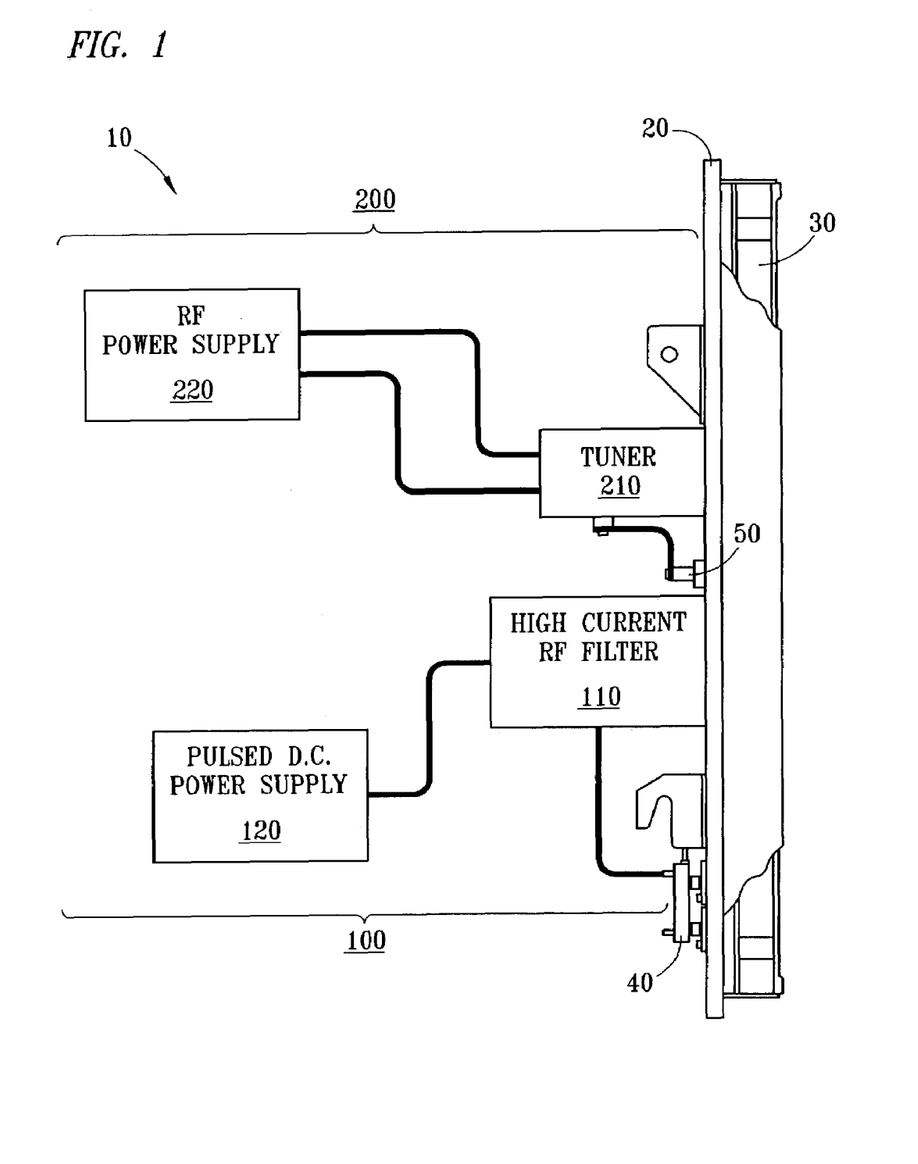
FIG. 1 is a conceptual diagram illustrating a portion of one arrangement of the sputtering apparatus of the present invention.

FIG. 1 depicts an arrangement of an arc suppression mechanism 10 of the present invention. A target mounting plate 20 can be used to hold the target, or cathode 30; or in some arrangements, a mounting plate 20 does not need to be used. The target/cathode 30, or if a target mounting plate is used, the target mounting plate 20, is electrically connected to two power sources, a pulsed DC power system 100 and an RF power system 200. The pulsed DC power supply 120 of the pulsed DC power system 100 is connected to a feed 40 located near the bottom of the cathode/target 30 or target mounting plate 20, by means of a high current RF Filter 110. The RF power supply 220 of the RF power system 200 is connected to a feed 50, typically located near the center of the cathode/target 30 or target mounting plate 20, by means of a tuner 210. In certain configurations of the present invention, the RF power supply 220 and the tuner 210 have been modified to incorporate equipment that can sense arcing occurring on the target and quickly shut down the RF power supply 220.

The arc suppression mechanism 10 of the present invention is intended for use inside a vacuum deposition chamber (not shown). While certain portions of the mechanism 10 can be located outside the vacuum chamber (not shown), such as the RF power supply 220, the pulsed DC power supply 120, the tuner 210, the filter box 110, and the target mounting plate 20, if used, the cathode/target 30 is typically located inside the vacuum deposition chamber (not shown). However, the specific arrangement and location of equipment varies from installation to installation. Permanent non-moving magnets, movable magnets, or rotary magnets (not shown) can be used to create confining magnetic fields of the cathodes in the vacuum chamber. The gas(es) used in the vacuum chamber (not shown) are dependent on the desired characteristics of the sputtered coating, as in the prior art.

The RF power supply 220 is connected to the cathode/target 30 through an RF tuner 210, the tuner 210 being mounted directly to the back of the cathode/target 30 or mounting plate 20. A commercially available RF power supply 220 and tuner 210, such as the model RFG3001 3KW RF Power Supply and the AZX90 Tuner, by Advanced Energy can be used in the present invention. The RF power supply 220 typically provides power to the cathode/target 30 at a frequency between about 1 MHz and 94 MHz.

It is sometimes necessary to modify the commercially available RF tuners 210 to include DC bias arc detection circuitry as well as RF arc detection circuitry, integrated with shutdown circuitry to electrically disconnect the RF power supply 220 from the cathode/target 30 when an arc is detected. By adding DC bias detection circuitry, such as that shown in FIG. 3 to the RF tuner along with standard RF detection circuitry, time delays in sensing arcing and responding by shutting down the RF power supply 220 are reduced, resulting in more responsive system reactions to an arc. The RF power supply 220 may also be modified to allow for fast shutdown and ramp up of the power supply, if necessary.

Standard RF arc detection circuitry has been used with the tuner 210 to calculate the dv/dt of the cathode/target 30 voltage. The calculated dv/dt is compared to a threshold voltage. When the value of dv/dt is greater than the threshold voltage, the output of the RF power supply 220 will be inhibited by the tuner 210. The response time from when the dv/dt measurement is determined to exceed the threshold value until the RF power supply 220 output is reduced and then returned to normal levels is approximately 150–200 microseconds, owing in part to the inherent delays in RF power supply 220 operation.

A continuous sampling of the voltage at the central cathode/target connection 50 for the RF power supply 220 is taken by means of a resistor network and compared to a threshold voltage value, which can be set to a value in the range of approximately 20 to 350 volts, and more preferably 70 to 120 volts, depending on the specific system and desired characteristics of the sputtered film, but the range can be from 20 to 350 volts. When the pulsed DC voltage to the cathode/target 30 is shut off in response to an arc, the voltage measured at the cathode/target 30 will drop, which serves as a signal to the RF power system 200 that an arc has occurred on the target 30, and the pulsed DC power supply 120 has been shut off in response to that arc. When the voltage measured at the cathode/target 30 is less than the threshold voltage value, the RF power supply 220 output will be shut down by clamping the set point/regulation circuit or performing an external shutdown of the RF power supply 220, depending on the specific arrangement of the present invention used. The response time from when the voltage measurement is determined to fall below the threshold value until the RF power supply 220 is shut down will vary depending on the system configuration, with an average being approximately 40 microseconds.

The pulsed DC power supply 120 is connected to the cathode/target 30 through a high current RF filter 110, the filter 110 being mounted directly to the back of the cathode/target 30 or mounting plate 20. The high current RF filter 110, which can be a standard Pi, Tee or LC filter, depending on the configuration of the arc suppression mechanism 10, isolates and separates the power provided by the pulsed DC power supply 120 from that provided by the RF power supply 220. A commercially available power supply, such as the Pinnacle Plus pulsed DC power supply, by Advanced Energy can be used in the present invention. It is preferred that the pulsed DC power supply 120 utilized incorporate an internal arc suppression mechanism.

The pulsed DC power system 100 typically monitors the cathode/target 30, and when an arc is detected, the pulsed DC power supply 120 is shut down for a period of time. The internal arc suppression mechanism of the pulsed DC power supply 120 is typically adjustable so that the detection time and shutdown time can be adjusted, with the adjustment method dependant upon the manufacturer of the pulsed DC power supply 120. The response time from when the voltage measurement at the cathode/target 30 is determined to fall below the threshold value until the pulsed DC power supply 120 is shut down is typically only a few microseconds. When the voltage at the cathode/target 30 drops because the pulsed DC power supply 120 has been shut down, the detection circuitry of the RF tuner 210 that is attached to the cathode/target 30 will detect the voltage drop, and act to shut down the RF power supply 220 as well, as described above.

Once the specified shut down time of the pulsed DC power supply 120 has been met, the pulsed DC power supply 120 will be turned on again.

In one arrangement of the present invention, the system can be configured such that if the pulsed DC power supply 120 is turned on again and another arc event is occurring simultaneously, the pulsed DC power supply 120 will shut down again, and the specified shutdown time for the pulsed DC power supply 120 will increase to some multiple of the shutdown time set in the pulsed DC power supply 120. After the pulsed DC power supply 120 has been shutdown for a time equal to the multiple of the shutdown time, it will come back on again. If it is turned back on a second time and yet another arc event is occurring simultaneously, the pulsed DC power supply 120 will shut down again, and the specified shutdown time for the pulsed DC power supply 120 will increase to some greater multiple of the shutdown time set in the pulsed DC power supply 120, set on the pulsed DC power supply. After the pulsed DC power supply 120 has been shutdown for a time equal to the greater multiple of the shutdown time, it will come back on again. This cycle of increasingly greater shutdown times will continue as long as the pulsed DC power supply 120 comes back on into a simultaneous arc event. After the pulsed DC power supply 120 successfully comes back on when there is no simultaneous arc event, the shutdown time will be reset to the time set in the pulsed DC power supply 120. This method is sometimes referred to as a "progressive arc shutdown."

When the DC voltage to the cathode/target 30 rises above the threshold specified in the RF tuner 210 sensor circuit, the RF power supply 220 will be turned back on, as well. Because there is an inherent delay in the RF power supply 220 being reactivated, the total time for the RF power supply 220 to come back on line is approximately 100–150 microseconds, although this time can be improved with circuit modifications. The total average time from the start of an arc on the cathode/target 30 until both the pulsed DC and RF power supplies, 120, 220 are shut off and back on again is less than 2500 microseconds, and preferably approximately 400 microseconds.

In addition to the severity of the arcing being reduced, due to increased responsiveness of the power systems 100, 200 when an arc is detected, because less oxidized material is produced with less severe arcs, the buildup on the surface of the target 30 occurs more slowly, and the number of incidents of arcing is reduced as well. Typically, in operation, once the system had warmed up, approximately 1–2 arcs/minute occurred, compared to hundreds or thousands of arcs/minute that can often be seen in typical systems, with the severity of the arcs typically being reduced as well.

The pulsed DC power supply 120 provides power to the target/cathode 30 according to an adjustable duty cycle between 0.1% to 99.9%, used at frequencies from about 0.1 MHz to about 20 MHz. Typically, the higher the frequency, the greater the duty cycle. For example, at 0.4 MHz, the duty cycle is typically 12–15%; at 1 MHz, the duty cycle is 25–40% and at 3 MHz the duty cycle is 50–70%. Duty cycle refers to the percentage of time that the pulsed DC power supply 120 is on. Therefore, a duty cycle of 15% refers to the situation where the pulsed DC power supply 120 is delivering power to the target 15% of each cycle. Thus, a frequency of 100 KHz with a duty cycle of 25% refers to a situation when the pulsed DC power supply 120, operating at a 100 KHz frequency is turned on for $2.5 \times 10^{-6}$ seconds and then is turned off for $7.5 \times 10^{-6}$ seconds and then the process is repeated. The preferred output from the pulsed DC power supply 120 during the power on phase is a constant power delivered at a constant voltage.

In the arrangement of the system 10 of the present invention depicted in FIG. 1, because RF and DC arc detection circuitry was incorporated into the RF Tuner 210, no physical connection between the pulsed DC power system 100 and the RF power system 200 was necessary to achieve the desired arc detection and protection.

Figure 2:
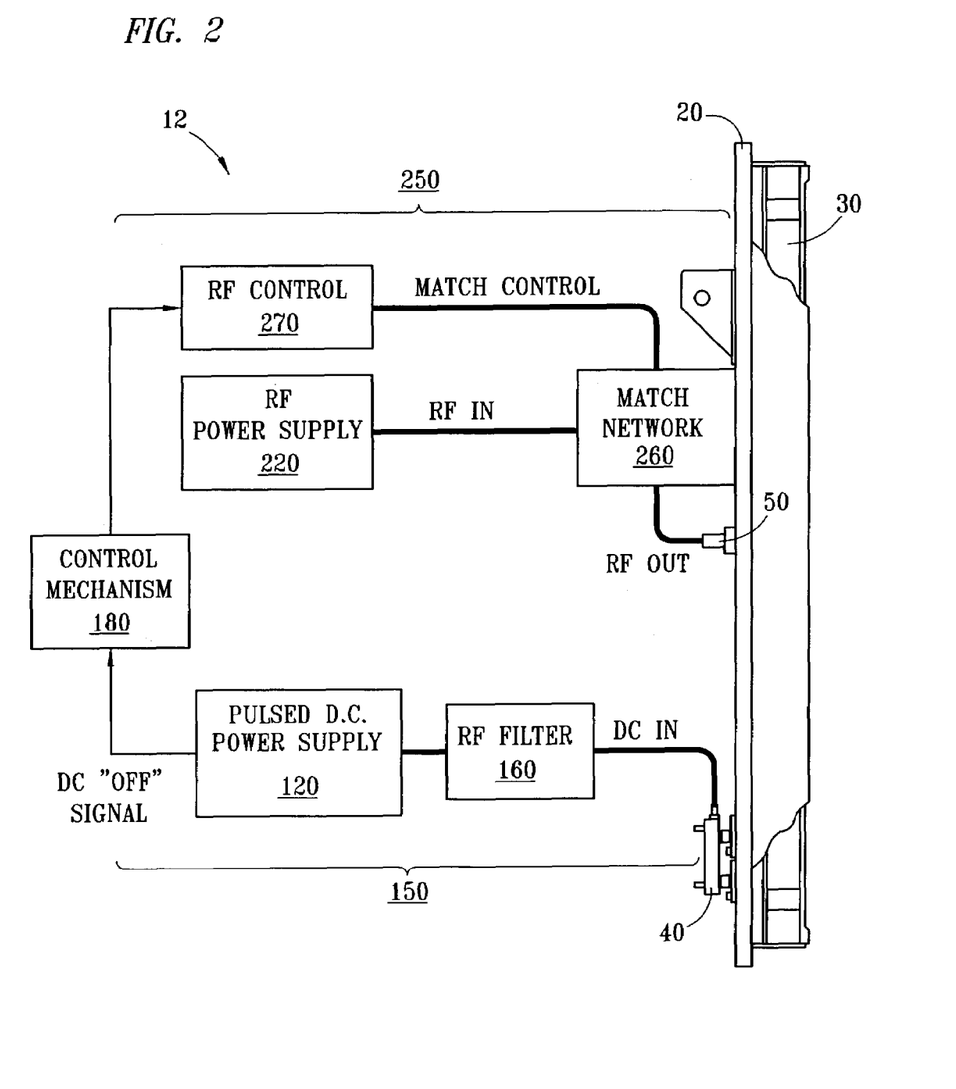
FIG. 2 is a conceptual diagram illustrating a portion of another arrangement of the sputtering apparatus of the present invention.

FIG. 2 depicts another arrangement of an arc suppression mechanism 12 of the present invention. In this arrangement, the pulsed DC power system 150 is connected to the RF power system 250 by means of a feedback control mechanism 180 that turns off the RF power supply 220 when the pulsed DC power supply 120 is shut down. In this arrangement, a target mounting plate 20 can be used to hold the target, or cathode 30, but is not needed in all configurations. The target/cathode 30, or if a target mounting plate is used, the target mounting plate 20, is electrically connected to the pulsed DC power system 150 and the RF power system 250. The pulsed DC power supply 120 of the pulsed DC power system 150 is connected to a feed 40 located near the bottom of the cathode/target 30 or target mounting plate 20, by means of an RF Filter 160. Without the RF filter 160 installed, it was found the RF power fed back into the pulsed DC power supply 120, which could damage the voltage sensing circuitry in the pulsed DC power supply 120. The RF power supply 220 is connected to the input of the matching network 260 and the RF power output is connected to a feed 50 located near the center of the cathode/target 30 or target mounting plate 20.

Figure 2A:
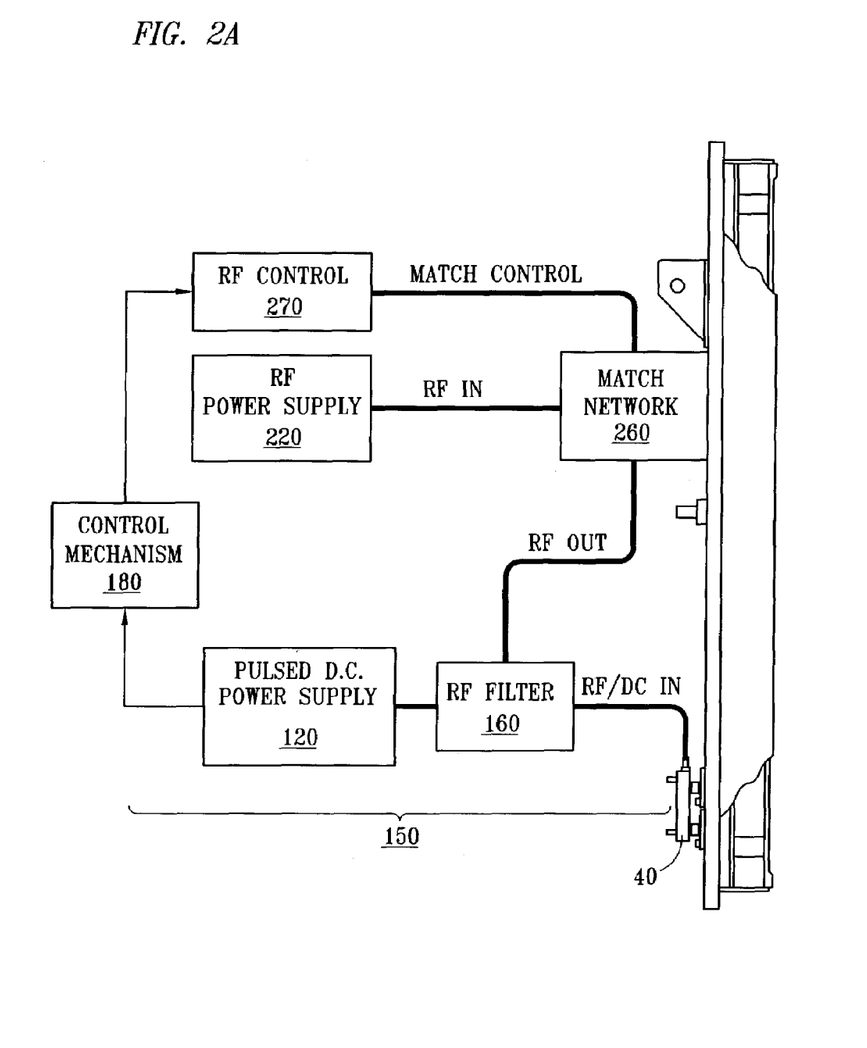
FIG. 2A is a conceptual diagram illustrating a portion of an alternative arrangement of the sputtering apparatus of the present invention as shown in FIG. 2.

An alternative arrangement of this system configuration is shown in FIG. 2A. In this arrangement, the RF power output from the matching network 260 is connected to the RF filter 160, and the RF power is processed into the feed 40 located near the bottom of the cathode/target 30 or the target mounting plate 20.

The matching network 260 blocks DC feedback from the RF power supply 220, to prevent the RF power supply 220 from being damaged by the DC feedback. In the arrangement of the present invention shown in FIGS. 2 and 2A, feedback between the pulsed DC power supply 120 and the RF control mechanism 270 for arc suppression is provided by means of the feedback control mechanism 180. When an arc occurs, the pulsed DC power system 150 senses the rapid drop in the cathode/target 30 voltage and shuts down the output of the pulsed DC power supply 120. This shut down in turn causes a signal to be sent from the pulsed DC power supply 120 to the RF power supply 220 via the feedback control mechanism 180 that shuts down the RF power supply 220 until the arc has stopped. The feedback control mechanism 180 feeds a high, or off signal to the RF control mechanism 270, which sends a signal to the RF power supply 220 by means of the RF inverter in the match network 260 to shut off the RF output. When the arc event has cleared and the pulsed DC power supply 120 is turned back on, the feedback control mechanism 180 sends a low/on signal to the RF control mechanism 270, which sends a signal to the match network 260 that will tell the RF power supply 220 to turn back on. The response time to shutdown the RF power supply 220 is very rapid in this arrangement of the present invention, typically less than 250 microseconds.

During testing of the various arrangements of the mechanism of the present invention, it was found that multiple arc suppression mechanisms 10, 12 operating independently of each other could be placed in close proximity, and there was no apparent effect on the ability of the units to suppress arcing, nor affect on the speed of the mechanisms caused by the proximity of other mechanisms.

The application of RF power with pulsed DC power also allows the operator to adjust the approximate maximum electron/ion energy level cap on the surface of the target if the sputtered film produced does not meet the desired specifications.

Generally, in prior art inventions, the gas pressure inside the vacuum chamber is maintained at about $2 \times 10-3$ Torr (0.3 pascal) when sputtering is being performed. Prior art processes also required that the magnetic field be a minimum 600 oersted (Oe) on the surface of the target. One unexpected benefit of using RF power in addition to the DC power in the present system is that the magnetic field, operating pressure and operating temperatures could be varied from those required in the prior art. The operating pressure in the vacuum chamber when sputtering is being performed in the present invention can typically maintained at about $1 \times 10-3$ to about $10 \times 10-3$ Torr, depending on the particular application, with a preferred range of about $1.5 \times 10-3$ to about $5.5 \times 10-3$ Torr. Operation of the system of the present invention has been shown to be effective at field strengths less than (and also greater than) 600 oersted, with the cathode/target being almost completely arc free.

Figure 3:
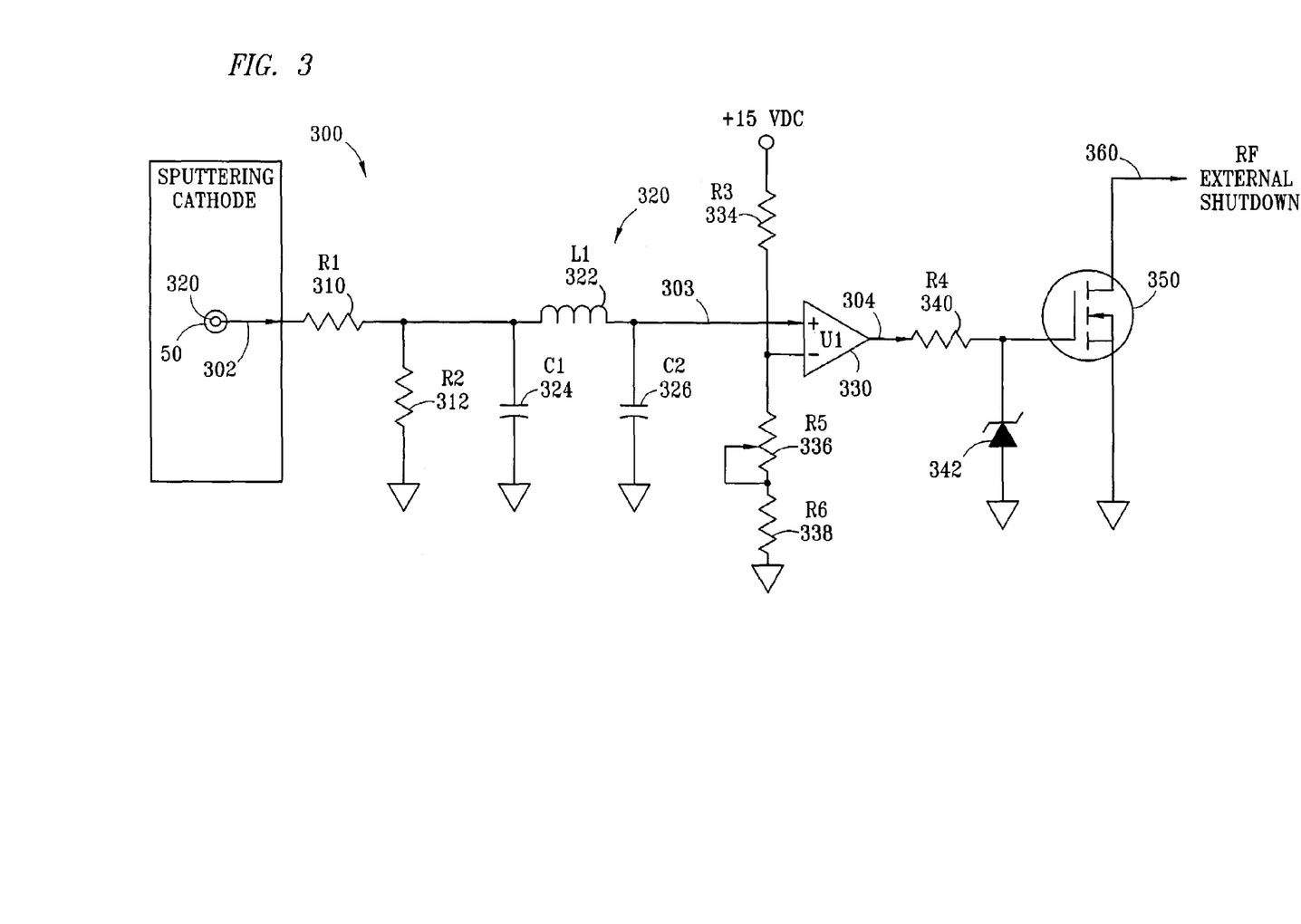
FIG. 3 is a representative circuit diagram showing the cathode DC bias shutdown circuitry.

FIG. 3 depicts a Cathode DC Bias Shutdown Circuit modification for the RF Tuner 210. The cathode DC bias shutdown circuit 300 continuously samples the voltage at the cathode feed 50. The voltage signal 302 enters the circuit through resistor R1 310. The voltage signal 302 is fed through resistor R2 312, which divides the voltage by a factor of 100 to yield a signal level of 10 volts for every 1000 volts read at the cathode 50. The RF voltage signal 302 is filtered out from the pulsed DC waveform by processing the signal through a filter 320, comprised of an inductor 322, and two capacitors, 324, 326. The filtered voltage signal 303 is fed into the positive side of a comparator 330, which compares the voltage signal 303 to a threshold voltage that is fed into the negative side of the comparator 330. The threshold voltage fed into the negative side of the comparator 330 is obtained by means of a threshold circuit 330, that provides an inverted input from resistors R3, 334; R5, 336; and R6, 338 that is 1 volt for every 100 volts on the cathode. When the filtered voltage signal 303 drops below the threshold voltage, the output of the comparator 330 is a high signal 304, approximately 15 volts in this case. This high signal 304 is clamped and limited by resistor R4, 340 and the 15 VDC Zener Diode, 342. The limited high signal 304 is fed into a MOSFET 350, turning the MOSFET 30 on, which clamps the RF shutdown signal 360, which drops the RF output voltage to zero. Depending on the arrangement and configuration of the arc suppression mechanism 10 used, the shutdown circuit 300 can be either internal or external to the RF power supply 220.

One arrangement of the present invention that was developed during testing is described here as an example of a specific system configuration, although many other configurations can be used. The system incorporates two arc suppression mechanisms 10 inside the vacuum chamber (not shown). The cathode/target 30 on each arc suppression mechanism 10 was 78 inches (1980 mm) in length. The adjacent cathode/targets 30 were positioned on a 14 inch center line, such that there was a 4 inch gap between the cathode bodies. The system was operated with a separate RF power supply 220 and pulsed DC power supply 120 connected to each cathode/target 30, with a discrete tuner 210 and high current RF filter 110 connected to each cathode/ target 30. The frequency of the RF power supply 220 was approximately 13.56 MHz. Although the cathode/targets 30 can have discrete anodes, the configuration in this system had no discrete anodes, relying on grounded surfaces in close proximity to serve as anodes. The cathode/targets 30 each incorporated side dark space shields (not shown) that extended only to the target plane; they did not extend beyond the target plane to form a containment box or anode.

Permanent non-moving magnets (not shown) were used to create confining magnetic fields in this arrangement of the invention. The horizontal fields of the magnets were in a range from 400 to 1200 Gauss. The target material was a 90/10 ratio of $In_2O_3$:SnO. A mix of oxygen, hydrogen and nitrogen was the gas used in the vacuum chamber in this arrangement of the present invention. The target to substrate distance was approximately 3.5" to 4" (89–102 mm). The operating pressure in the vacuum chamber when sputtering was being performed was maintained at about $3.5 \times 10^{-3}$ Torr to $4.5 \times 10^{-3}$ Torr.

Tests were performed using a system as above. Based on calculations and measurements of the produced coating, the arc detection threshold in the system 10 was set to approximately 75 VDC. The test results at various power levels were as follows:

| RF | Pulsed VDC |
| --- | --- |
| At 1 KW in the pulsed DC power supply: | |
| 0 KW | 241 |
| 0.5 KW | 124 |
| >0.5 KW | <75 (not recorded) |
| At 2 KW in the pulsed DC power supply: | |
| 0 KW | 252 |
| 1.5 KW | 105 |
| >1.5 KW | <75 (not recorded) |
| At 3 KW in the pulsed DC power supply: | |
| 0 KW | 259 |
| 3.0 KW | 104 |
| >3.0 KW | <75 (not recorded) |
| At 4 KW in the pulsed DC power supply: | |
| 0 KW | 265 |
| 3.0 KW | 119 |
| >3.0 KW | <75 (not recorded) |

Figure 4:
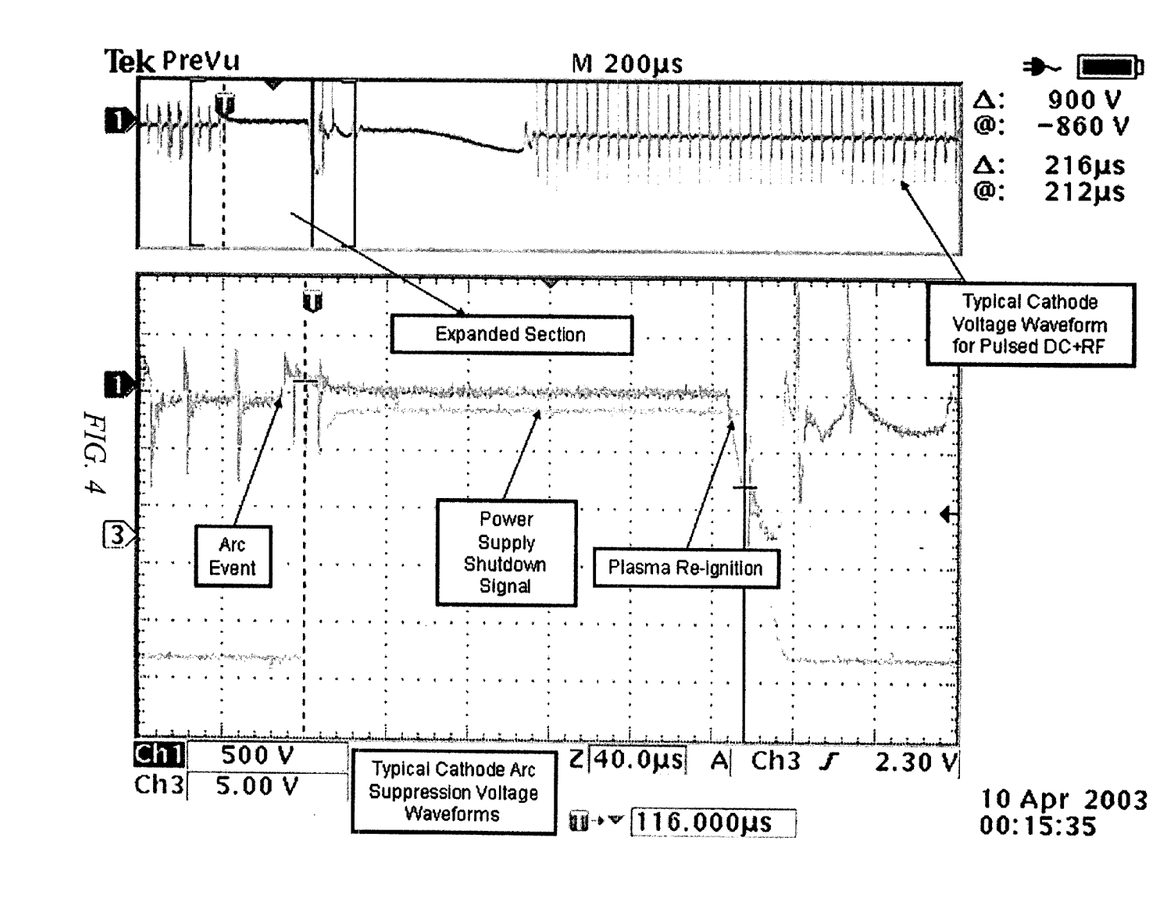
FIG. 4 is an oscilloscope tracing of the electrical activity over time when an arc is detected in a system of the present invention.

FIG. 4 is an oscilloscope tracing of the electrical activity over time when an arc is detected in a system of the present invention. Channel 1 shows the activity of the filtered DC cathode voltage being monitored, and channel 3 shows the RF On/Off signal. When the arc suppression mechanism of the pulsed DC power supply detects an arc event, 410, the pulsed DC power supply is shut down for a period of time. When the voltage at the cathode/target drops because the pulsed DC power supply has been shut down, the detection circuitry of the RF power system that is attached to the cathode/target will detect the voltage drop, and act to shut down the RF power supply as well, 420. As can be seen in the tracing, the time from when voltage measurement is determined to fall below the threshold value until the RF power supply is shut down is only a few microseconds.

Once the predefined shut down time of the pulsed DC power supply has been met, the pulsed DC power supply will be turned on again, 430. When the DC voltage to the cathode/target rises above the threshold specified in the RF power system, the RF power supply will be turned back on, as well, 440.

Figure 5:
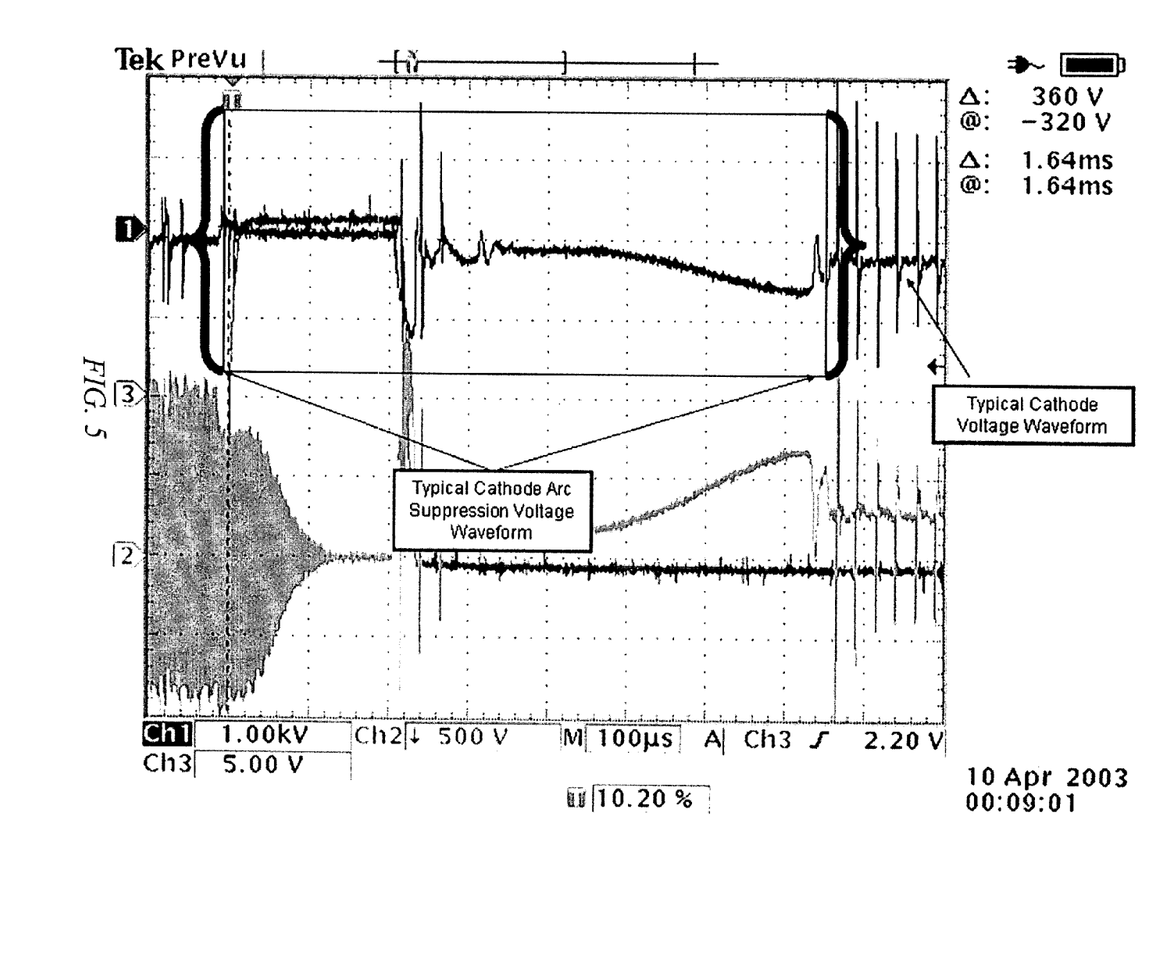
FIG. 5 is an oscilloscope tracing of the electrical activity over time when an arc is detected in a system of the present invention showing the pulsed DC voltage at the cathode and showing the pulsed DC power with RF interference filtered out.

FIG. 5 is an oscilloscope tracing of the electrical activity over time when an arc is detected in a system of the present invention. Channel 1 shows the activity of the filtered DC cathode voltage being monitored, and channel 2 shows the unfiltered DC cathode voltage, while channel 3 shows the RF On/Off signal. When the arc suppression mechanism of the pulsed DC power supply detects an arc, 510, the pulsed DC power supply is shut down for a specified period of time. When the voltage at the cathode/target drops because the pulsed DC power supply has been shut down, the detection circuitry in the RF power system that is attached to the cathode/target will detect the voltage drop, and act to shut down the RF power supply as well, 520. As can be seen in the tracing, the time from when voltage measurement is determined to fall below the threshold value until the RF power supply is shut down is only a few microseconds.

Once the predefined shut down time of the pulsed DC power supply has been met, the pulsed DC power supply will be turned on again 530. When the DC voltage to the cathode/target rises above the threshold specified in the RF power system, the RF power supply will be sent a signal to turn back on as well, 540. Note that there is an inherent delay in the RF power supply being reactivated 550, and the time for the RF power supply to come back on line.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

The invention claimed is:

1. A method of performing magnetron sputter deposition, the method comprising:
    applying RF power to at least one target from at least one Radio Frequency (RF) power supply;
    applying pulsed DC voltage to the at least one target from at least one pulsed DC power system; and
    controlling the RF power supply by sending a signal from a DC bias detection circuit to the RF power supply if the pulsed DC voltage to the target is below a predetermined threshold.

2. A method according to claim 1 wherein the step of applying pulsed DC voltage further comprises reversing the polarity of the voltage supplied to the target during at least a portion of the power application.

3. A method of suppressing arcing on a target during a magnetron sputter deposition process, the method comprising:
    applying pulsed DC power to the target from a pulsed DC power system;
    applying RF electrical power to the target from an RF power system;
    monitoring the electrical power at the target to detect an electrical arc on a surface of the target;
    shutting down the pulsed DC power supply when an electrical arc is detected on the surface of the target;
    monitoring the DC voltage at the target by a DC bias detection circuit to detect when the pulsed DC voltage to the target falls below a predefined threshold voltage; and when the DC bias detection circuit detects the reduction in power to the target, sending a signal to the RF power supply to shut down.

4. A method according to claim 3 wherein the step of applying pulsed DC voltage further comprises reversing the polarity of the voltage supplied to the target during at least a portion of the power application.

5. A method according to claim 3 wherein the pulsed DC power supply has a frequency of at least 0.1 MHz and not greater than 20 MHz.

6. A method according to claim 3 wherein the pulsed DC power supply has a duty cycle of at least 0.1% and not greater than 99.9%.

7. A method according to claim 3 further comprising sending a signal to the pulsed DC power supply to turn back on when a predefined time has elapsed.

8. A method according to claim 3 further comprising sending a signal to the RF power supply to, turn back on when the pulsed DC power supply output voltage exceeds a predefined threshold voltage.

9. A method according to claim 3 wherein the threshold voltage is at least 20 volts and not greater than 350 volts.

10. A method according to claim 3 wherein the time from when the electrical arc is detected on the surface of the target until the RF power supply is turned back on is less than 2500 microseconds.

11. A method according to claim 7 further comprising sensing an electrical arc on the target when turning the pulsed DC power supply back on, and shutting down the pulsed DC power supply for a multiple of the predefined time period in response to detecting the electrical arc on the target.

12. A method according to claim 11 further comprising sensing an electrical arc on the target when turning the pulsed DC power supply back on after the multiple of the predefined time period, and shutting down the pulsed DC power supply for a larger multiple of the predefined time period in response to detecting the electrical arc on the target.

13. A method according to claim 11 or 12 further comprising not sensing an electrical arc on the target when turning the pulsed DC power supply back on after some multiple of the predefined time period, and resetting the predefined time period to its original value.

14. A method of suppressing arcing on a target during a magnetron sputter deposition process, the method comprising:
  applying pulsed DC voltage to the target from a pulsed DC power system;
  applying RF electrical power to the target from an RF power supply;
  providing feedback to the RF power system from the pulsed DC power system;
  monitoring the electrical voltage at the target to detect an electrical arc on a surface of the target;
  shutting down the pulsed DC power supply when an electrical arc is detected on the surface of the target; and
  sending a signal to the RF power system from the pulsed DC power system when the pulsed DC power supply has been shut down to shut down the RF power supply.

15. A method according to claim 14 the step of applying pulsed DC voltage further comprises reversing the polarity of the voltage supplied to the target during at least a portion of the power application.

16. A method according to claim 14 wherein the pulsed DC power supply has a frequency of at least 0.1 MHz and not greater than 20 MHz.

17. A method according to claim 14 wherein the pulsed DC power supply has a duty cycle of at least 0.1% and not greater than 99.9%.

18. A method according to claim 14 wherein the RF power supply has a frequency of at least 1 MHz and not greater than 100 MHz.

19. A method according to claim 14 further comprising sending a signal to the pulsed DC power supply to turn back on when a predefined time has elapsed.

20. A method according to claim 19 further comprising sending a signal to the RF power supply by means of the feedback control mechanism to turn back on when the pulsed DC power supply has been turned back on.

21. A method according to claim 14 wherein a time from when the pulsed DC power to the target falls below the predefined threshold until the RF power supply is shut down is less than 250 microseconds.

22. A method according to claim 14 further comprising sensing an electrical arc on the target when turning the pulsed DC power supply back on, and shutting down the pulsed DC power supply for a multiple of the predefined time period in response to detecting the electrical arc on the target.

23. A method according to claim 22 further comprising sensing an electrical arc on the target when turning the pulsed DC power supply back on after the multiple of the predefined time period, and shutting down the pulsed DC power supply for a larger multiple of the predefined time period in response to detecting the electrical arc on the target.

24. A method according to claim 22 or 23 further comprising not sensing an electrical arc on the target when turning the pulsed DC power supply back on after some multiple of the predefined time period, and resetting the predefined time period to its original value.

25. A method according to claim 14 wherein the method further comprises blocking the feedback from the pulsed DC power supply by a filter unit.

26. A method according to claim 14 wherein the method further comprises blocking DC feedback from the RF power supply by a match network.

27. An apparatus for suppressing arcs on a target in a vacuum sputter deposition system, the apparatus comprising:
  a pulsed DC power system comprising at least:
    a pulsed DC power supply;
    a filter unit; and
    a sensor;
  an RF power system comprising at least:
    an RF power supply;
    a tuner; and
    a DC bias detection circuit;
  a target that is electrically connected to the pulsed DC power system and the RF power system;
  the sensor in the pulsed DC power system monitoring a surface of the target to detect an electrical arc, sending a signal to the pulsed DC power supply to shut down when an electrical arc is detected on the surface of the target; and
  a DC bias detection circuit for detecting when the pulsed DC power to the target falls below a predefined threshold and sending a signal to the RF power supply to shut down.

28. An apparatus according to claim 27 wherein the pulsed DC power supply reverses the polarity of the voltage supplied to the target during at least a portion of the power application.

29. An apparatus according to claim 27 wherein the pulsed DC power supply has a frequency of at least 0.1 MHz and not greater than 20 MHz.

30. An apparatus according to claim 27 wherein the pulsed DC power supply has a duty cycle of at least 0.1% and not greater than 99.9%.

31. An apparatus according to claim 27 wherein the RF power supply has a frequency of at least 1 MHz and not greater than 100 MHz.

32. An apparatus according to claim 27 wherein the pulsed DC power supply has a duty cycle of at least 10% and not greater than 20% and a frequency of at least 0.25 MHz and not greater than 0.6 MHz.

33. An apparatus according to claim 27 wherein the pulsed DC power supply has a duty cycle of at least 20% and not greater than 45% and a frequency of at least 0.75 MHz and not greater than 1.25 MHz.

34. An apparatus according to claim 27 wherein the pulsed DC power supply has a duty cycle of at least 45% and not greater than 70% and a frequency of at least 2.5 MHz and not greater than 4 MHz.

35. An apparatus according to claim 27 wherein the RF power system is electrically connected to the target by means of a feed located in a central portion of the target and the pulsed DC power system is electrically connected to the target by means of a feed located near an end of the target.

36. An apparatus according to claim 27 further comprising a mounting plate to which the target is attached, the RF power system being electrically connected to the target by means of a feed located in a central portion of the target mounting plate and the pulsed DC power system being electrically connected to the target by means of a feed located near an end of the target mounting plate.

37. An apparatus according to claim 27 wherein a signal is sent by the sensor to the pulsed DC power supply to turn back on when a predefined time has elapsed.

38. An apparatus according to claim 37 wherein after the pulsed DC power supply has turned back on, a signal is sent to the RF power supply to turn back on.

39. An apparatus according to claim 37 wherein the sensor further comprises means for detecting an electrical arc on the target when turning the pulsed DC power supply back on, and shutting down the pulsed DC power supply for a multiple of the predefined time period in response to detecting the electrical arc on the target.

40. An apparatus according to claim 39 wherein the sensor further comprises means for sensing an electrical arc on the target when turning the pulsed DC power supply back on after the multiple of the predefined time period, and shutting down the pulsed DC power supply for a larger multiple of the predefined time period in response to detecting the electrical arc on the target.

41. An apparatus according to claim 39 or 40 wherein the sensor further comprises means for sensing an electrical arc is not occurring on the target when turning the pulsed DC power supply back on after some multiple of the predefined time period, and resetting the predefined time period to its original value.

42. An apparatus in accordance with claim 27 wherein the operating pressure in the vacuum sputter deposition system chamber is maintained between $1.0*10^{-3}$ Torr and $10*10^{-3}$ Torr.

43. An apparatus in accordance with claim 27 wherein a magnetic field maintained on the target surface in the vacuum sputter deposition chamber is less than 600 oersted.

44. An apparatus for suppressing arcs on a target in a vacuum sputter deposition system, the apparatus comprising:
a pulsed DC power system comprising at least:
a pulsed DC power supply;
a filter unit; and
a sensor;
an RF power system comprising at least:
an RF power supply;
an RF control; and
a match network;
a target that is electrically connected to the pulsed DC power system and the RF power system;
the sensor in the pulsed DC power system monitoring a surface of the target to detect an electrical arc on a surface of the target and sending a signal to the pulsed DC power supply to shut down when an electrical arc is detected on the surface of the target; and
a feedback control mechanism capable of detecting a shut down of the pulsed DC power supply and sending a signal to the RF power supply to shut down.

45. An apparatus according to claim 44 wherein the pulsed DC power supply reverses the polarity of the voltage supplied to the target during at least a portion of the power application.

46. An apparatus according to claim 44 wherein the pulsed DC power supply has a frequency of at least 0.1 MHz and not greater than 20 MHz.

47. An apparatus according to claim 44 wherein the pulsed DC power supply has a duty cycle of at least 0.1% and not greater than 99.9%.

48. An apparatus according to claim 44 wherein the RF power supply has a frequency of at least 1 MHz and not greater than 100 MHz.

49. An apparatus according to claim 44 wherein the pulsed DC power supply has a duty cycle of at least 10% and not greater than 20% and a frequency of at least 0.25 MHz and not greater than 0.6 MHz.

50. An apparatus according to claim 44 wherein the pulsed DC power supply has a duty cycle of at least 20% and not greater than 45% and a frequency of at least 0.75 MHz and not greater than 1.25 MHz.

51. An apparatus according to claim 44 wherein the pulsed DC power supply has a duty cycle of at least 45% and not greater than 70% and a frequency of at least 2.5 MHz and not greater than 4 MHz.

52. An apparatus according to claim 44 wherein the RF power system is electrically connected to the target by means of a feed located in a central portion of the target and the pulsed DC power system is electrically connected to the target by means of a feed located near an end of the target.

53. An apparatus according to claim 44 wherein the RF power system is electrically connected to a feed located near an end of the target by means of the filter unit of the pulsed DC power system, and the pulsed DC power system is electrically connected to the feed located at the end of the target.

54. An apparatus according to claim 44 further comprising a mounting plate to which the target is attached, the RF power system being electrically connected to the target by means of a feed located in a central portion of the target mounting plate and the pulsed DC power system being electrically connected to the target by means of a feed located near an end of the target mounting plate.

55. An apparatus according to claim 44 further comprising a mounting plate to which the target is attached, the RF power system being electrically connected to the target by means of a feed located near an end of the mounting plate by means of the filter unit of the pulsed DC power system, and the pulsed DC power system being electrically connected to the target by means of a feed located near an end of the mounting plate.

56. An apparatus according to claim 44 wherein a signal is sent by the sensor to the pulsed DC power supply to turn back on when a predefined time has elapsed.

57. An apparatus according to claim 44 wherein after the pulsed DC power supply has turned back on, a signal is sent to the RF power supply by the control mechanism to turn back on.

58. An apparatus according to claim 56 wherein the sensor further comprises means for detecting an electrical arc on the target when turning the pulsed DC power supply back on, and shutting down the pulsed DC power supply for a multiple of the predefined time period in response to detecting the electrical arc on the target.

59. An apparatus according to claim 58 wherein the sensor further comprises means for sensing an electrical arc on the target when turning the pulsed DC power supply back on after the multiple of the predefined time period, and shutting down the pulsed DC power supply for a greater multiple of the predefined time period in response to detecting the electrical arc on the target.

60. An apparatus according to claim 58 or 59 wherein the sensor further comprises means for sensing an electrical arc is not occurring on the target when turning the pulsed DC power supply back on after some multiple of the predefined time period, and resetting the predefined time period to its original value.

61. An apparatus according to claim 44 wherein the filter unit blocks RF feedback from the pulsed DC power supply.

62. A method according to claim 44 wherein the match network blocks DC feedback from the RF power supply.

63. An apparatus in accordance with claim 44 wherein the operating pressure in the vacuum sputter deposition system chamber is maintained between about $1.0*10^{-3}$ Torr and $10*10^{-3}$ Torr.

64. An apparatus in accordance with claim 44 wherein a magnetic field maintained on the target surface in the vacuum sputter deposition chamber is less than 600 oersted.

* * * * *